US007494852B2

(12) United States Patent
Bedell et al.

(10) Patent No.: US 7,494,852 B2
(45) Date of Patent: Feb. 24, 2009

(54) METHOD FOR CREATING A GE-RICH SEMICONDUCTOR MATERIAL FOR HIGH-PERFORMANCE CMOS CIRCUITS

(75) Inventors: Stephen W. Bedell, Wappingers Falls, NY (US); Bruce B. Doris, Brewster, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,477

(22) Filed: Jan. 6, 2005

(65) Prior Publication Data

US 2006/0148143 A1    Jul. 6, 2006

(51) Int. Cl.
*H01L 21/84* (2006.01)
*H01L 21/00* (2006.01)

(52) U.S. Cl. .................. 438/149; 438/150; 438/162; 438/479; 438/520; 438/528

(58) Field of Classification Search .............. 438/479, 438/480, 149, 162, 163, 514, 517
See application file for complete search history.

(56) References Cited

U.S. PATENT DOCUMENTS

| 4,710,478 | A | * | 12/1987 | Yoder et al. ............. 438/169 |
| 5,426,069 | A | * | 6/1995 | Selvakumar et al. ........ 438/60 |
| 5,633,194 | A | * | 5/1997 | Selvakumar et al. ....... 117/103 |
| 5,879,996 | A | | 3/1999 | Forbes |
| 6,124,620 | A | | 9/2000 | Gardner et al. |
| 6,138,606 | A | | 10/2000 | Ling |
| 6,251,835 | B1 | * | 6/2001 | Chu et al. ................ 505/411 |
| 6,403,981 | B1 | * | 6/2002 | Yu ........................... 257/63 |
| 6,461,945 | B1 | * | 10/2002 | Yu ........................... 438/510 |
| 6,498,107 | B1 | * | 12/2002 | Fenner ..................... 438/706 |
| 6,638,832 | B2 | | 10/2003 | Brady et al. |
| 6,709,909 | B2 | | 3/2004 | Mizuno et al. |
| 6,709,935 | B1 | * | 3/2004 | Yu ........................... 438/289 |

(Continued)

FOREIGN PATENT DOCUMENTS

JP    64-79363    3/1989

(Continued)

OTHER PUBLICATIONS

C.T. Huang, et al., "The Influence of Ge-Implantation on the Electrical Characteristics of the Ultra-Shallow Junction Formed by Using Silicide as a Diffusion Source", IEE Electron Device Letters, vol. 17, No. 3, Mar. 1996.

(Continued)

*Primary Examiner*—Zandra Smith
*Assistant Examiner*—Khanh B Duong
(74) *Attorney, Agent, or Firm*—Scully, Scott, Murphy & Presser, P.C.; Yuanmin Cai

(57) ABSTRACT

A method of forming a surface Ge-containing channel which can be used to fabricate a Ge-based field effect transistor (FET) which can be applied to semiconductor-on-insulator substrates (SOIs) is provided. The disclosed method uses Ge-containing ion beams, such as cluster ion beams, to create a strained Ge-containing rich region at or near a surface of a SOI substrate. The Ge-containing rich region can be present continuously across the entire surface of the semiconductor substrate, or it can be present as a discrete region at a predetermined surface portion of the semiconductor substrate.

18 Claims, 3 Drawing Sheets

U.S. PATENT DOCUMENTS

| | | |
|---|---|---|
| 6,768,121 B2 | 7/2004 | Horsky et al. |
| 6,882,025 B2 * | 4/2005 | Yeo et al. .................. 257/510 |
| 6,902,962 B2 * | 6/2005 | Yeo et al. .................. 438/150 |
| 6,960,517 B2 * | 11/2005 | Rios et al. .................. 438/595 |
| 6,987,037 B2 * | 1/2006 | Forbes .................. 438/197 |
| 6,995,075 B1 * | 2/2006 | Usenko .................. 438/458 |
| 7,394,202 B2 * | 7/2008 | Horsky et al. .......... 315/111.81 |
| 2002/0063294 A1 | 5/2002 | Brown et al. |
| 2003/0215990 A1 | 11/2003 | Fitzgerald et al. |
| 2004/0060900 A1 | 4/2004 | Waldhauer et al. |

OTHER PUBLICATIONS

Proc. IEEE, vol. 89, No. 3, Mar. 2001.

* cited by examiner

METHOD FOR CREATING A GE-RICH SEMICONDUCTOR MATERIAL FOR HIGH-PERFORMANCE CMOS CIRCUITS

FIELD OF THE INVENTION

The present invention relates to a semiconductor material and a method of fabricating the same. More particularly, the present invention relates to a semiconductor material including a Ge rich region that is located at or near a surface of a semiconductor-on-insulator (SOI) substrate, i.e., within a portion or all of the upper SOI layer of an SOI substrate, as well as a method of forming the same. The Ge rich region can be present atop the entire surface of the SOI substrate or it can be present as a discrete region at a predetermined surface portion of the SOI substrate.

BACKGROUND OF THE INVENTION

For more than three decades, the continued miniaturization of silicon-based metal oxide semiconductor field effect transistors (MOSFETs) has driven the worldwide semiconductor industry. Various impediments to continued scaling have been predicted for decades, but a history of innovation has sustained Moore's Law in spite of many challenges. Recently, however, there have been indications that Si-based metal oxide semiconductor transistors are beginning to reach their traditional scaling limits. A concise summary of near-term and long-term challenges to continued complementary metal oxide semiconductor (CMOS) scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore CMOS performance through continued scaling, methods for improving performance without scaling have become critical. One approach for doing this is to increase carrier (electron and/or hole) mobilities. For example, there are ongoing efforts to increase the performance of CMOS devices by altering the material used to form the conduction channel in such a way that charge carrier transport is increased in comparison with conventional Si-based semiconductors. Ge has carrier mobility that is significantly higher than that of Si and therefore has been the subject of renewed interest in the CMOS community. Ge layers under compressive strain have an even higher charge carrier mobility than that of unstrained Ge. Bulk Ge wafers are becoming available, but a Ge-on-insulator (GeOI) material as well as a bulk substrate including a surface region comprising Ge have proven to be far more difficult to fabricate. Additionally, due to the large lattice mismatch between Ge and Si (4.17%), it is difficult to grow strained Ge surface layers that remain both planar (smooth) and stable against the generation of strain-relieving dislocations.

In view of the state of the art mentioned above, there is a need for providing a method of fabricating a Ge-containing substrate material in which a Ge rich region is located at or near a surface of a semiconductor substrate, in a strained state, resistant to plastic relaxation and existing over a buried insulating layer. Ge-containing substrate material including the surface Ge rich region can be used as a substrate in which CMOS devices, such as FETs, can be fabricated thereon.

SUMMARY OF THE INVENTION

The present invention provides a method of forming a strained surface Ge-containing channel that can be used to fabricate a Ge-based field effect transistor (FET) which can be applied to semiconductor-on-insulator (SOI) substrates. The present invention uses Ge-containing cluster ion beams or other low-energy ion beams such as plasma immersion implantation and low-energy ion or molecular beam implantation to create a Ge rich region at or near a surface of a SOI substrate. Preferably, Ge-containing cluster ions beams are employed. In particular, the Ge rich region is located within the SOI layer, e.g., upper or top layer, of the SOI substrate. The ion beam bombardment of the semiconductor surface allows Ge-containing ions to be introduced into the near surface by means of a unique, non-equilibrium manner upon impact, i.e., thermal shock. It has been shown previously (see, for example, U.S. patent application Ser. No. 10/654,232, filed Sep. 3, 2003) that SOI substrates with a top Si layer thickness less than about 500 Å can be used to suppress the relaxation of strained layers grown thereupon. By using ion cluster beam bombardment (or one of the other aforementioned low energy ion beams) to create a Ge-rich surface layer on a thin SOI layer (less than about 500 Å), a thin, planar, strained, and largely relaxation resistant Ge-rich region can be formed for use with high performance Ge FET applications.

In accordance with the present invention, the Ge rich region can be present continuously across the entire surface of the SOI substrate, or it can be present as a discrete region at a predetermined surface portion of the semiconductor substrate.

In broad terms, the method of the present invention comprises incorporating Ge-containing ions into a surface region, e.g., the SOI layer, of a SOI substrate utilizing a Ge-containing ion beam.

The SOI substrate can be bare or a patterned mask can be formed thereon such that the Ge-containing ions are introduced into a predetermined area of the semiconductor substrate.

DETAILED DESCRIPTION OF THE INVENTION

Figure 1A:
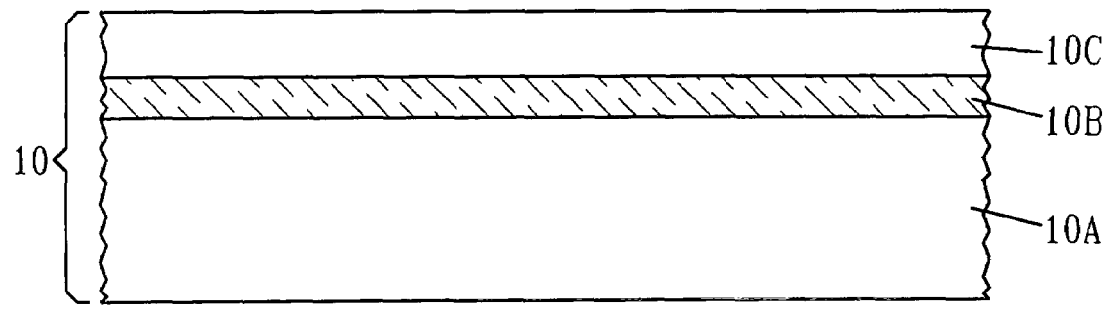
FIGS. 1A-1C are pictorial representations (through cross sectional views) illustrating the basic processing steps of forming a Ge rich region at or near a surface of a SOI substrate. In the embodiment depicted in these drawings, the Ge rich region is present continuously across the entire surface of the SOI substrate.

The present invention, which provides a method of fabricating a Ge rich channel region for high performance CMOS circuits, will now be described in greater detail by referring to the drawings that accompany the present application. The drawings of the present invention are provided for illustrative purposes and thus they are not drawn to scale. In particular, the various thicknesses of the SOI substrate material layers have been exaggerated. It is also noted that the Ge region rich 14 can be located within an upper surface region of the SOI layer 10C or it can be present throughout the entire layer, if so desired.

Figure 1B:
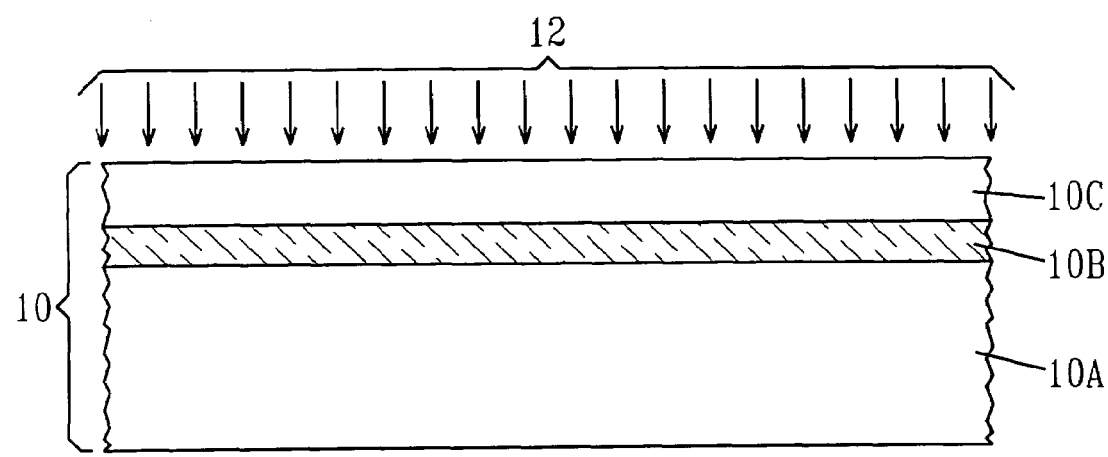
Figure 1C:
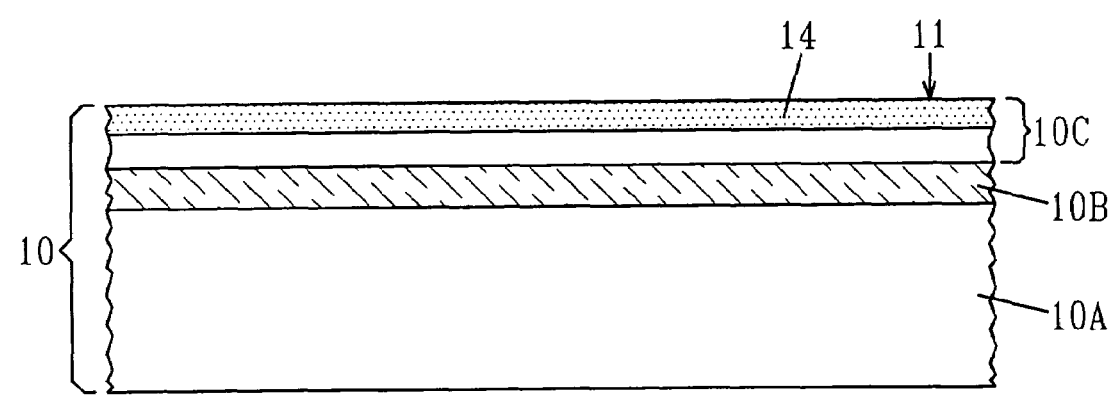

Reference is first made to FIGS. 1A-1C which illustrate the basic processing steps employed in a first embodiment of the present invention. In the illustrated embodiment, which will be described in greater detail hereinbelow, the processing provides a semiconductor material in which a Ge rich region is present continuously at or near the surface of a semiconductor substrate material. It is emphasized that at least a portion of the Ge rich region is used in the present invention as a channel of a Ge-containing FET.

The first embodiment of the present invention begins by first providing or selecting a SOI substrate 10 such as shown in FIG. 1A. The SOI substrate 10 includes a bottom semiconductor material 10A, a buried insulating layer 10B, and a top semiconductor material 10C. The semiconducting material represented by layers 10A and 10C include, for example, the same or different semiconducting material such as Si, SiGe, SiC, SiGeC, InAs, InP, GaAs or mulitlayers thereof such as, Si/SiGe. In one embodiment of the present invention, the semiconductor substrate is typically a silicon-on-insulator substrate that has a top Si layer thickness of less than 500 Å.

As is known to one skilled in the art, semiconductor-on-insulators comprise an upper semiconductor layer 10C and a lower semiconductor layer 10A having a continuous or non continuous (i.e., patterned) buried insulating region 10C located between the two semiconductor layers. The buried insulating region may comprise an oxide, nitride or oxynitride, with an oxide being more typical. The semiconductor-on-insulators are fabricated using known processes including, for example, a layer transfer process, or a SIMOX (separation by ion implantation of oxygen) process. The techniques used to form the semiconductor-on-insulator material are not critical to the present invention.

The semiconductor substrate 10 may be strained (fully) or relaxed (partially or fully) depending on the technique used in forming the same. In one embodiment of the present invention, the semiconductor substrate 10 includes a relaxed SiGe layer. Upon subsequent bombardment with a Ge-containing ion beams, a strained Ge rich region is created in the structure. In all cases, the upper semiconductor layer 10C, either Si or SiGe is less than 500 Å in order to inhibit relaxation of the Ge-rich region.

The semiconductor substrate 10 can have any of the well known major or minor crystallographic axes such as (110). Illustratively, the semiconductor substrate 10 can have a (111), (100) or other crystallographic orientations. Semiconducting layer 10A may have the same or different crystallographic orientation than semiconducting layer 10C.

FIG. 1B shows the structure during the blanket incorporation of Ge-containing ions 12 into the upper semiconductor layer 10C of the semiconductor substrate 10, while FIG. 1C shows the structure after completion of this blanket Ge-containing incorporation. As shown, Ge-containing ions 12 are incorporated into the semiconductor substrate 10 such that a Ge rich region 14 is formed at or near the surface 11 of the semiconductor substrate. By "at or near the surface of the semiconductor substrate" it is meant that the Ge rich region 14 is present a depth, as measured from surface 11 to an upper surface of the Ge rich region 14, of about 20 nm or less. More typically, the Ge rich region 14, as shown in FIG. 1C, is present at the surface 11 of the semiconductor substrate 10.

In accordance with the present invention, the incorporation of Ge-containing ions is achieved using a Ge-containing cluster ion beam bombardment process or any other low energy ion beam technique for Ge doping such as plasma immersion implantation and low energy ion or molecular beam implantation. Preferably, and for the remaining discussion, Ge-containing cluster ion beam bombardment is employed. The ion cluster beam bombardment of the semiconductor substrate 10 allows for Ge-containing ions 12 to be introduced into the near surface by means of a non-equilibrium manner upon impact, e.g., by thermal shock. The term "Ge-containing ions" is used herein to denote a cluster of atoms which comprises at least Ge.

The ion bombardment process is carried out in any conventional cluster ion beam apparatus. The apparatus typically includes a supersonic adiabatic expansion nozzle that passes into an implantation chamber. The chamber is typically maintained at a low pressure of less than about 100 milliTorr. Typically, the nozzle tapers radially such that its inner diameter decreases in direction toward the inner portion of the implantation chamber. Several types of pumps, e.g., mechanical booster pumps, diffusion pumps and turbo-molecular pumps, may be used to evacuate the implantation chamber. The implantation system also includes an ionizer and an acceleration tube. The semiconductor substrate 10, i.e., target, into which the ionic clusters are to be bombarded is positioned on the opposite end of the chamber from the nozzle.

The bombardment process includes passing a source comprising the species to be accelerated through the nozzle and into the chamber. An inert gas, such as He, Ne, Ar, Xe, Kr or mixtures thereof, may serve as the carrier gas. In accordance with the present invention, a Ge-containing source may be passed into the nozzle to provide for the bombardment of Ge-containing ions 12 into the semiconductor substrate 10. As a result of being passed through the nozzle, the Ge-containing source, which is typically comprised of gaseous molecules, is supercooled, and thus become clusters of atoms, or collimated neutral cluster beams. Those clusters of atoms are then ionized into Ge-containing ions by electron bombardment within implantation chamber. A mass filter and a static lens system comprising several electrostatic field plates with small apertures may be positioned within the chamber between the ionizer and the acceleration tube. The static lens system and the mass filter may be used to select particular sizes of the ionized clusters, i.e., Ge-containing ions 12, for implantation.

Those ionized clusters chosen for bombardment are electrostatically accelerated toward the semiconductor substrate 10 as they pass through the acceleration tube so that they gain energy. Upon striking the semiconductor substrate 10, the ionized clusters, i.e., Ge-containing ions 12, break up into individual atoms. The total energy of each ionized cluster is uniformly distributed across its corresponding atoms. As such, each atom has a low energy ranging from a few electron volts (eV) to hundreds of eV, depending on the cluster size and accelerating voltage. The low energy of each atom entering the semiconductor substrate allows the atoms to be incorporated at a shallow depth, as described above. A detailed description of the gas cluster ion beam process can be found, for example, in I. Yamada, et al., "Gas Cluster Ion Beam Processing For ULSI Fabrication", J., Material Resources Society Symposium Proceedings, Volume 427, pp. 265-274 (incorporated herein by reference).

The Ge-containing source used in the present invention for generating Ge-containing ions may be a solid source, a liquid source or a gaseous source, with gaseous Ge-containing sources being highly preferred. The Ge-containing source can include at least one of Ge; $GeO_2$; $Ge(R)_4$ wherein each R independently is the same or different and comprises hydrogen, a $C_1$-$C_{12}$ alkane (straight chained or branched, substituted or unsubstituted), a halide such as chloride, iodide, fluoride or bromide, an alkoxy containing from 1 to about 12 C atoms, a cycloalkane, phenyl (substituted or unsubstituted), deuterium, or an alkylsilyl containing from 1 to about 12 carbon atoms; or $Ge_2H_6$. Preferably, $GeH_4$ (germane) is used as the Ge-containing source.

The amount of Ge-containing source used can vary depending on the final concentration of the Ge-containing ions 12 to be incorporated into the semiconductor substrate 10. Typically, the amount of Ge-containing source used in the present invention provides a concentration of Ge-containing ions 12 within the semiconductor substrate 10 of from about $1 \times 10^{21}$ atoms/cm$^3$ up to pure Ge. The concentration of Ge-containing ions is located mainly within the Ge rich region 14.

Due to the large amount of energy being deposited at the surface of semiconductor substrate 10, it is possible that surface amorphization can occur during the bombardment process. Therefore, maintaining the semiconductor substrate 10 at an elevated temperature during the bombardment process can be used to retain crystallinity during bombardment. A temperature between 200° and 850° C. can be used during bombardment.

Figure 2A:
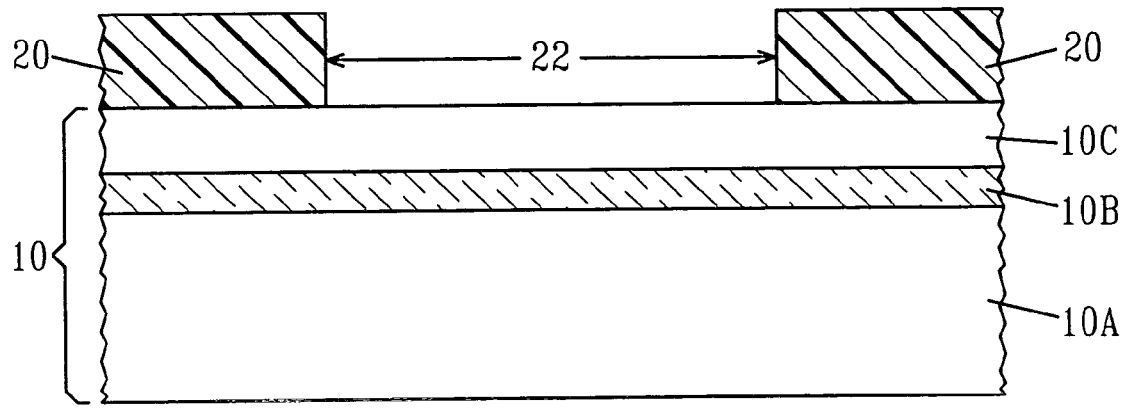
FIGS. 2A-2C are pictorial representations (through cross sectional views) illustrating the basic processing steps of forming a Ge rich region at or near a surface of a SOI substrate. In the embodiment depicted in these drawings, the Ge rich region is present as a discrete region located at a predetermined surface portion of the SOI substrate.
Figure 2B:
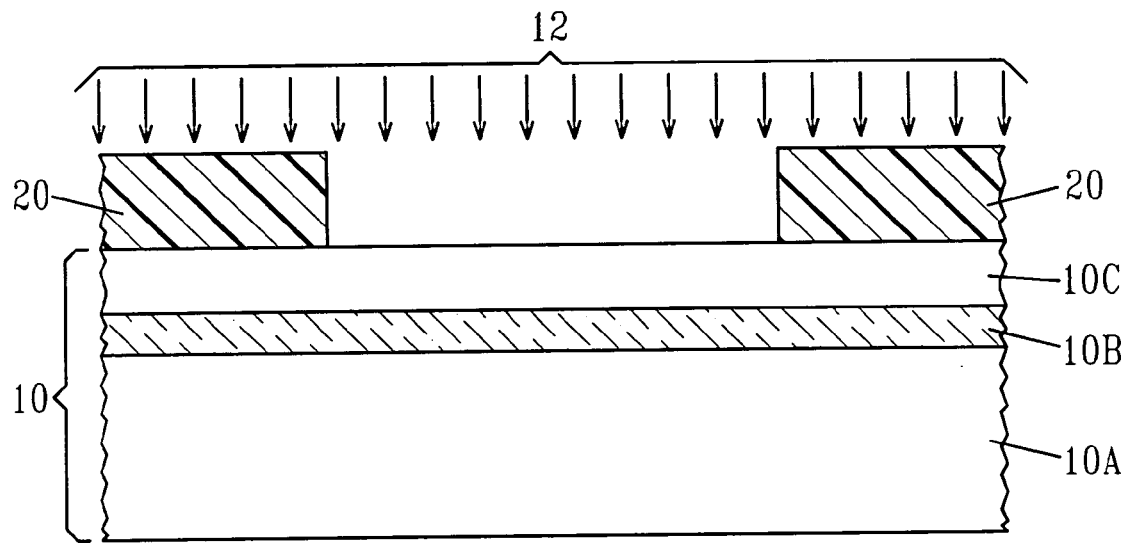
Figure 2C:
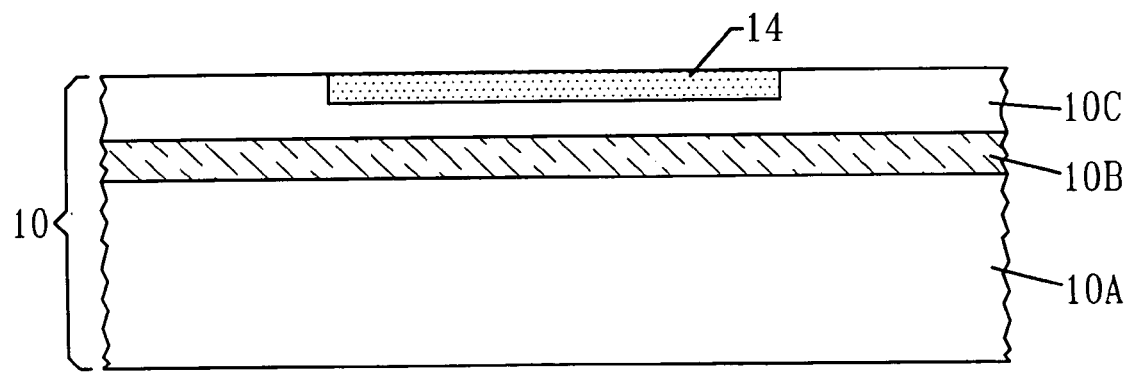

In addition to the embodiment depicted in FIGS. 1A-1C and described above in which Ge-containing ions are continuously incorporated into the semiconductor substrate 10, the present invention also contemplates an embodiment in which the Ge-containing ions are incorporated into discrete and predetermined portions of the semiconductor substrate 10. This is achieved in the present invention by providing a mask to the surface of the semiconductor substrate 10 prior to bombardment with Ge-containing cluster ion beams. This embodiment of the present invention is depicted in FIGS. 2A-2C wherein patterned mask 20 is used. FIG. 2A shows the initial structure used including semiconductor substrate 10 and patterned mask 20 having at least one opening 22. The at least one opening 22 exposes a portion of the semiconductor substrate 10.

The patterned mask 20 having at least one opening 22 is formed by applying a mask material and patterning the applied mask material via lithography and optionally etching. The mask material employed in the present invention comprises a photoresist material, a hardmask including an oxide or a nitride, or a combination thereof. When the photoresist is used as the mask material, the etching step is not required. When the hardmask is used as the mask material, the etching step is required since a separate patterned resist will be used in the pattern transfer process. Application of the mask material may be performed by a conventional deposition process including, for example, spin-on coating, evaporation, chemical vapor deposition (CVD) or plasma enhanced chemical vapor deposition (PECVD). Etching is achieved by a dry etching process (including reactive-ion etching, ion beam etching, plasma etching or laser ablation) or a wet etching process can be used.

The thickness of the mask material may vary depending on the type of mask material employed as well as the technique that was used to apply the same. Typically, the thickness of the mask material must be sufficiently thick enough to prevent Ge-containing ions 12 from being incorporated into the semiconductor substrate 10. A typically thickness for the mask material is from about 50 to about 2000 nm.

FIG. 2B shows the structure during the cluster ion beam bombardment process and FIG. 2C shows the structure after the bombardment process and after the patterned mask 20 has been removed by a conventional stripping process, etching, or planarization. In some instances, the patterned mask 20 may remain and can be used during the fabrication of the FET. In this embodiment, the Ge rich region 14 is a discrete region that is formed within a predetermined area of the semiconductor substrate 10. In this embodiment of the present invention, adjacent regions of the substrate can have different crystallographic orientations. That is, the substrates that can be employed in this embodiment may have a plurality of regions with differing crystallographic orientations. These substrates are referred to as hybrid orientated substrates (HOT) and can also be used in the first embodiment described above.

In either embodiment (unpatterned or patterned) described above, an annealing step (in lieu of, or in addition to, the thermal treatment during bombardment) can follow the ion cluster beam bombardment of the semiconductor substrate to either recrystallize the Ge-rich region in the case of complete amorphization, or to reduce the defectivity of the Ge-rich region after bombardment. The annealing step is carried out in an inert atmosphere such as He, Ar, Ne or a mixture thereof. The annealing step may be performed by a thermal anneal, a laser anneal, a microwave anneal or any other annealing technique that is capable of recrystallizing the amorphous or defective Ge-rich region. The annealing temperature can be from 200° C. up to the melting point of the material (which, for pure Ge, is 938° C.), with an annealing temperature from about 250° to about 900° C. being more typical. The annealing step can be performed using various times which are dependent on the exact annealing technique used. The annealing step can be performed using RTA or furnace steps or combinations thereof. In one embodiment, the thermal treatment is limited in time and temperature in such a way that recrystallization occurs, while limiting the extent of downward Ge diffusion into the underlying thin Si layer. A 700° to 850° C. anneal for less than 30 minutes successfully is capable of recrystallizing the Ge-rich region, while limiting Ge diffusion.

Because low-energy bombardment of materials can increase the surface roughness, an optional step of a surface smoothing anneal can be used in addition to (or in lieu of) the previous anneal steps. Such a surface smoothing anneal can be a hydrogen anneal. In this anneal the semiconductor substrate 10 is subjected to a H-containing ambient (preferably pure $H_2$) for a period from a few seconds to 30 minutes at a temperature ranging from 500° to 925° C. The hydrogen can optionally be diluted with an inert gas such as He, Ar or $N_2$ (forming gas). In some embodiments, ultra-pure Ar can be optionally used in lieu of $H_2$. In addition to annealing, smoothing of the surface can be achieved by other planarization techniques such as chemical mechanical polishing (CMP) or by gaseous techniques.

Figure 3A:
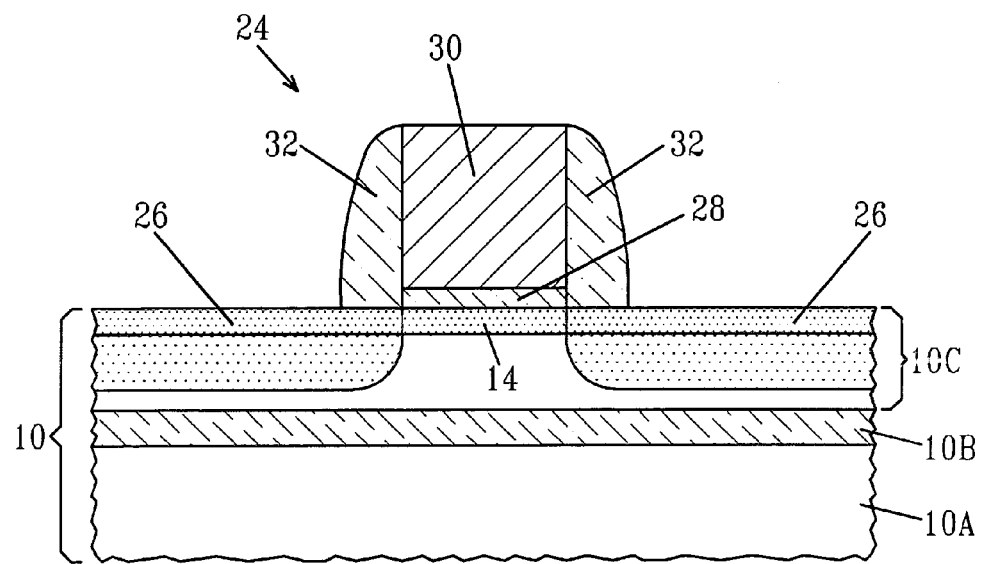
FIGS. 3A-3B are pictorial representations (through cross sectional views) illustrating semiconductor structures including FETs located on the substrate material provided in FIGS. 1A-1C, and FIGS. 2A-2C, respectively.
Figure 3B:
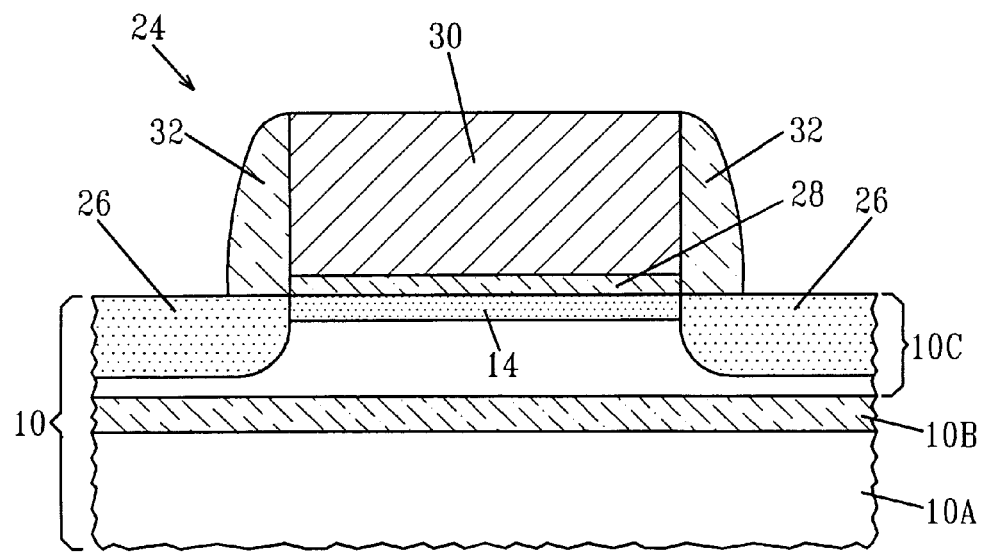

FIGS. 3A-3B shows the structures of FIGS. 1C and 2C, respectively, after at least one FET 24 is formed thereon. The at least one FET 24 includes a source and drain region 26, a gate dielectric 28, a gate conductor 30, and optionally at least one spacer 32. The at least one FET 24 is formed utilizing any conventional CMOS process that is well known to those skilled in the art. For example, a CMOS process in which blanket layers of the gate dielectric and gate conductor are deposition and then patterned by lithography and etching can be used. Alternatively, the at least one FET 24 can be formed by a replacement gate process in which a dummy, i.e., sacrificial, gate material is employed.

At least one isolation region (not shown) can be located within the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

The gate dielectric 28 can be formed by a thermal growth process such as, for example, oxidation, nitridation or oxynitridation, or by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric 28 may also be formed utilizing any combination of the above processes.

The gate dielectric 28 is comprised of an inorganic insulating material such as $SiO_2$. In some embodiments, the gate dielectric 20 is comprised of an insulating material having a dielectric constant of greater than about 4.0, preferably greater than 7.0. Specifically, the gate dielectric 28 employed in the present invention includes, but is not limited to: an oxide, nitride, oxynitride, and/or silicate (including metal silicates and nitrided metal silicates). In one embodiment, it is preferred that the gate dielectric 28 is comprised of an oxide having a high k such as, for example, $HfO_2$, $HfSiO_2$, $ZrO_2$, $Al_2O_3$, $TiO_2$, $La_2O_3$, $SrTiO_3$, $LaAlO_3$, $Y_2O_3$, or mixtures thereof.

The physical thickness of the gate dielectric 28 may vary, but typically, the gate dielectric 28 has a thickness from about 0.5 to about 10 nm, with a thickness from about 0.5 to about 3 nm being more typical.

The gate conductor 30 is then formed atop the gate dielectric 28 utilizing a known deposition process such as, for example, physical vapor deposition, CVD, sputtering or evaporation. The gate conductor 30 includes a Si-containing material, a conductive metal or metal alloy, a metal silicide, a metal nitride or combinations thereof. Preferably, the gate conductor 30 comprises a Si-containing material such as polysilicon, SiGe and SiGeC. The Si-containing material used in forming the gate conductor 30 is in single crystal, polycrystalline or amorphous form, or consists of mixtures of such forms.

The gate conductor 30 may be doped or undoped. If doped, an in-situ doping deposition process may be employed in forming the same. Alternatively, the gate conductor 30 can be formed by deposition, ion implantation and annealing. The doping of the gate conductor 30 shifts the workfunction of the gate conductor formed. Illustrative examples of dopant ions include As, P, B, Sb, Bi, In, Al, Ga, or mixtures thereof. The thickness, i.e., height, of the gate conductor 30 may vary depending on the deposition process employed. Typically, the gate conductor 30 has a vertical thickness from about 20 to about 180 nm, with a thickness from about 40 to about 150 nm being more typical.

A dielectric cap layer (not shown) can be formed atop the gate conductor utilizing a deposition process such as, for example, physical vapor deposition or chemical vapor deposition. The dielectric cap layer may be an oxide, nitride, oxynitride or any combination thereof. The thickness, i.e., height, of the dielectric cap layer is from about 20 to about 180 nm, with a thickness from about 30 to about 140 nm being more typical.

In addition to the gate dielectric 28 and the gate conductor 30, the at least one FET 24 also includes at least one spacer 32. The at least one spacer 32 is comprised of an insulator such as an oxide, nitride, oxynitride and/or any combination thereof. The at least one spacer 32, which is formed by deposition and etching, can be formed prior to or after formation of the gate dielectric and gate conductor depending on the technique used for forming the FET.

The width of the at least one spacer 32 must be sufficiently wide such that the source and drain silicide contacts (to be subsequently formed) do not encroach underneath the edges of the gate stack. Typically, the source/drain silicide does not encroach underneath the edges of the gate stack when the at least one spacer 32 has a width, as measured at the bottom, from about 20 to about 80 nm.

The source and drain regions 26 shown in FIGS. 3A and 3B may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

The structures shown in FIGS. 3A and 3B can be subjected to further CMOS processing including, for example, formation of silicide contacts, raised S/D formation, passivation, etc. Also, the structures shown in FIGS. 3A and 3B can be subjected to conventional back-end-of-the-line, i.e., interconnect, processing. It is noted that in FIGS. 3A and 3B the source drain regions 26 can extend to the upper surface of the buried insulating layer 14C.

While the present invention has been particularly shown and described with respect to preferred embodiments thereof, it will be understood by those skilled in the art that the foregoing and other changes in forms and details may be made without departing from the spirit and scope of the present invention. For example, a bulk semiconductor substrate may be used in lieu of the SOI substrate mentioned herein. It is therefore intended that the present invention not be limited to the exact forms and details described and illustrated, but fall within the scope of the appended claims.

What is claimed is:

1. A method of fabricating a semiconductor material comprising:
   incorporating Ge-containing ions into a surface region of an upper semiconductor material layer of a semiconductor-on-insulator (SOI) substrate utilizing Ge-containing cluster ion bombardment, said Ge-containing cluster ion bombardment retains crystallinity of said upper semiconductor material layer and provides a strained Ge-containing rich region at or near said surface region of said upper semiconductor material layer, yet within said upper semiconductor material layer.

2. The method of claim 1 wherein said upper semiconductor material layer comprises Si.

3. The method of claim 1 wherein said SOI substrate includes a patterned mask having at least one opening located therein.

4. The method of claim 1 wherein said Ge-containing cluster ion bombardment includes a Ge-containing source.

5. The method of claim 4 wherein said Ge-containing source is a solid, liquid or gas.

6. The method of claim 5 wherein said Ge-containing source is a gas.

7. The method of claim 4 wherein said Ge-containing source comprises one of Ge; $GeO_2$; $Ge(R)_4$ wherein each R independently is the same or different and comprises hydrogen, a $C_1$-$C_{12}$ alkane, a halide, an alkoxy containing from 1 to about 12 C atoms, a cycloalkane, phenyl, deuterium, or an alkylsilyl containing from 1 to about 12 carbon atoms; or $Ge_2H_6$.

8. The method of claim 7 wherein said Ge-containing source comprises germane, $GeH_4$.

9. The method of claim 4 wherein said Ge-containing source provides a concentration of said Ge-containing ions within said upper semiconductor material layer of said SOI substrate from about $1\times10^{21}$ atoms/cm$^3$ up to pure Ge.

10. The method of claim 1 further comprising forming at least one field effect transistor atop said SOI substrate, said at least one field effect transistor includes a portion of said SOI comprising said Ge-containing ions as a device channel.

11. A method of forming a semiconductor material comprising:

selecting a semiconductor-on-insulator having at least an upper semiconductor material layer; and providing a strained Ge-containing rich region within said upper semiconductor material layer at or near a surface thereof utilizing a Ge-containing cluster ion bombardment including a Ge-containing source, wherein during said Ge-containing cluster ion bombardment crystallinity of said upper semiconductor material layer is retained.

12. The method of claim 11 wherein said SOI includes a patterned mask having at least one opening.

13. The method of claim 11 wherein said Ge-containing source is a solid, liquid or gas.

14. The method of claim 11 wherein said Ge-containing source comprises one of Ge; $GeO_2$; $Ge(R)_4$ wherein each R independently is the same or different and comprises hydrogen, a $C_1$-$C_{12}$ alkane, a halide, an alkoxy containing from 1 to about 12 C atoms, a cycloalkane, phenyl, deuterium, or an alkylsilyl containing from 1 to about 12 carbon atoms; or $Ge_2H_6$.

15. The method of claim 14 wherein said Ge-containing source comprises $GeH_4$.

16. The method of claim 11 wherein said Ge-containing source provides a concentration of said Ge-containing ions within said SOI from about $1\times^{21}$ atoms/cm$^3$ up to pure Ge.

17. The method of claim 11 further comprising forming at least one field effect transistor atop said SOI, said at least one field effect transistor includes a portion of said SOI comprising said Ge-containing ions as a device channel.

18. A method of fabricating a semiconductor material comprising:

incorporating Ge-containing ions into a surface region of an upper semiconductor material layer of a semiconductor-on-insulator (SOI) substrate through at least one opening of a patterned mask utilizing Ge-containing cluster ion, said Ge-containing cluster ion bombardment retains crystallinity of said upper semiconductor material layer and provides a strained Ge-containing rich region at or near said surface region of said upper semiconductor material layer, yet within said upper semiconductor material layer.

* * * * *